United States Patent
Ryken, Jr. et al.

(10) Patent No.: US 6,885,348 B1
(45) Date of Patent: Apr. 26, 2005

(54) TEST CHAMBER FOR A LOW BAND ANTENNA ARRAY

(76) Inventors: Marvin L. Ryken, Jr., 1021 Lucero St., Oxnard, CA (US) 93030; Albert F. Davis, 9053 Santa Margarita Ct., Ventura, CA (US) 93004; Steven J. Renga, 133 Japonica Ct., Camarillo, CA (US) 93012

( * ) Notice: Subject to any disclaimer, the term of this patent is extended or adjusted under 35 U.S.C. 154(b) by 0 days.

(21) Appl. No.: 10/712,220

(22) Filed: Nov. 12, 2003

(51) Int. Cl.[7] .............................................. G01R 29/10
(52) U.S. Cl. ...................................... 343/703; 324/627
(58) Field of Search .......................... 343/703; 324/627, 324/628; 250/505.1, 506.1; 333/212, 227

(56) References Cited

U.S. PATENT DOCUMENTS 6,657,214 B1 * 12/2003 Foegelle et al. .......... 250/506.1
6,795,030 B2 * 9/2004 Klingler et al. ............. 343/703
2004/0183547 A1 * 9/2004 Kildal ........................ 324/627

* cited by examiner

Primary Examiner—Hoang V. Nguyen
(74) Attorney, Agent, or Firm—David S. Kalbaugh

(57) ABSTRACT

A Test Chamber for testing a frequency response of a Low Band Antenna Array output by injecting an RF test signal into the interior of the test chamber. The test chamber comprises a rectangular shaped steel enclosure having a lid. A microwave absorptive foam is affixed to the interior walls and base of the enclosure. The lid for the enclosure includes an opening and a pair of alignment pins for positioning the array's monopole antennas within the interior of the test chamber. A probe is located in one corner of the test chamber to provide the RF test signal to the array's monopole antennas.

20 Claims, 2 Drawing Sheets

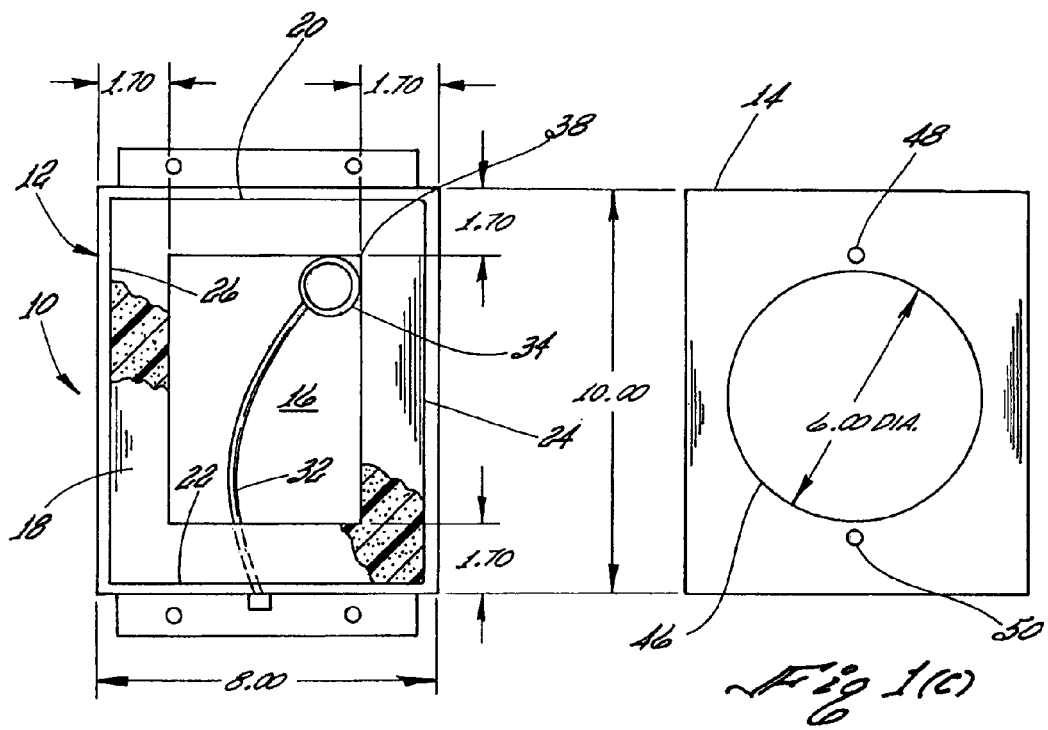
Fig 1(a)
Fig 1(c)
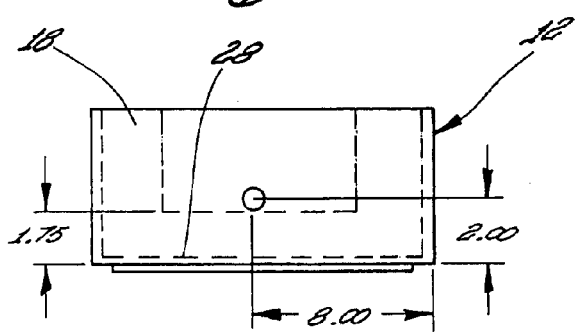
Fig 1(b)

TEST CHAMBER FOR A LOW BAND ANTENNA ARRAY

BACKGROUND OF THE INVENTION

1. Field of the Invention

The present invention relates generally to testing of antenna arrays. More specifically, the present invention relates to a miniature test chamber for the ALR-67 Radar Warning Receiver antenna array.

2. Description of the Prior Art

The ALR-67 Radar Warning Receiver is an advanced Countermeasure Receiving Set that is the standard U.S. Navy radar warning receiver that is deployed on carrier based F/A-18 tactical aircraft. The ALR-67 Radar Warning Receiver, which includes a countermeasure computer is designed to enhance the survivability of pilots and their aircraft in a hostile environment. The ALR-67 Radar Warning Receiver also has a low band antenna array which is mounted on the aircraft fuselage in proximity to the cockpit.

There is currently a need to test the ALR-67 Low Band Antenna Array as an integral part of a total system for the ALR-67 Radar Warning Receiver. The testing needs to be performed over the frequency range of operation of the ALR-67 Low Band Antenna Array. Previous attempts to design a test chamber for the antenna array have not been acceptable in that the test chamber achieved acceptable operation over only a very small portion of ALR-67 Low Band Antenna Array's frequency range of operation.

There is a need to provide an anechoic chamber which is small in size and constructed so that electromagnetic interference does enter or exit the chamber. There is also a need to provide a test signal to the ALR-67 Low Band Antenna Array at a specific azimuthal angle. The frequency response of the antenna array should be 30 dB+/−10 dB over the frequency range of operation of the antenna array with no resonance peaks or dropouts.

SUMMARY OF THE INVENTION

The present invention comprises a Test Chamber for testing a frequency response of a Low Band Antenna Array output by injecting an RF test signal into the interior of the test chamber. The test chamber comprises a rectangular shaped steel enclosure having a lid. A microwave absorptive foam is affixed to the interior walls and base of the steel enclosure. The lid for the enclosure includes an opening and a pair of alignment pins for positioning the low band antenna array's monopole antennas within the interior of the test chamber. A probe is located in one corner of the test chamber to provide the RF test signal to the low band antenna array's monopole antennas.

The test chamber test the full frequency range of operation of the low band frequency antenna array. The microwave absorptive foam lining the interior walls of the steel enclosure and the base of the enclosure minimizes electromagnetic reflections within the interior of the test chamber. Minimizing the reflections of the injected signal produces no ambiguous input signals to the Low Band Antenna Array.

The test chamber also provides for isolation of internal RF signals by preventing the signals from radiating outside of test chamber 10 and isolates external RF signals from entering test chamber 10 which causes interference.

BRIEF DESCRIPTION OF THE DRAWINGS

FIG. 1(a) is a top view of the ALR-67 Low Band Antenna Array Test Chamber without a lid;

FIG. 1(b) is an end view of the test chamber of FIG. 1(a);

FIG. 1(c) is a top view of the lid for the test chamber of FIG. 1(a);

DETAILED DESCRIPTION OF A PREFERRED EMBODIMENT

Figure 1D:
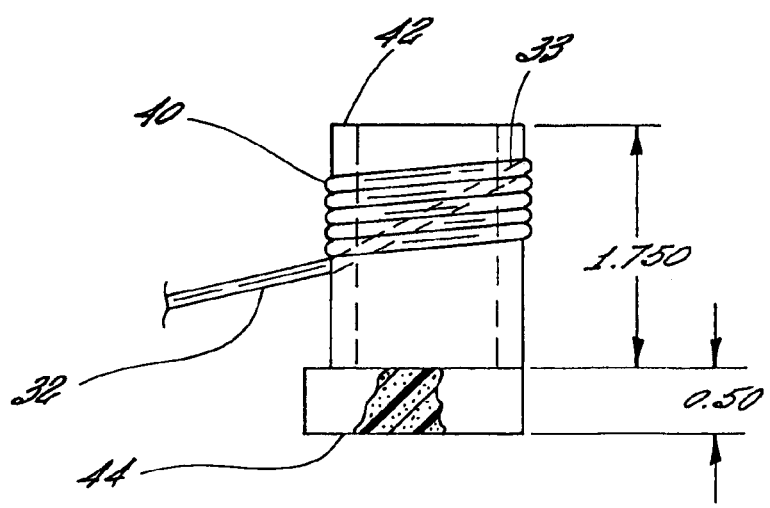
FIG. 1(d) depicts the probe utilized with the test chamber of FIG. 1(a)

Referring to FIGS. 1(a)–1(d), there is shown an ALR-67 low band antenna array test chamber, designated generally by the reference numeral 10 which is used to test the antenna array for the ALR-67 Radar Warning Receiver. The test chamber 10 comprises a rectangular shaped steel enclosure 12 with a removable lid 14. The steel enclosure has overall dimensions of 10.00" (length)×8.00" (width)×4.00" (depth). The steel enclosure 12 used in the present invention is a Lift-Off cover "LP" box, Part No. A1008LP, which is commercially available from Hoffman Enclosures Inc. of Anoka, Minn. The dimensions shown in FIGS. 1(a)–1(c) are in inches.

The interior 16 of enclosure 12 is filled with a microwave absorptive foam 18 as shown in FIGS. 1(a) and 1(b). Microwave absorptive foam 18 is affixed to the interior of rear wall 20, front wall 22, and side walls 24 and 26 of enclosure 12 and the base 28 of enclosure 12. The thickness of microwave absorptive foam 18 is approximately 1.70 inches. The microwave absorptive foam used in the present invention is ECCOSORB AN Flexible Foam Sheet, Part No. AN-77 which is commercially available from Emerson and Cuming Microwave Products Inc. of Randolph, Mass.

An SMA female connector 30 is mounted on front wall 22 of enclosure 12 at the midpoint of the front wall 22. A 0.141 inch diameter cable 32 connects the SMA female connector 30 to a probe 34. The positioning of the cable 32 and the probe 34 in the interior 16 of enclosure 12 as depicted in FIG. 1(a) is through the microwave absorptive foam 18 and then across the bottom of the interior 16 of enclosure 12 to probe 34. Probe 34 is positioned at corner 38 within the interior 16 of enclosure 12.

As is best illustrated in FIG. 1(d), probe 34 includes five helical turns of #22 solid copper wire 40 wound around the exterior of a one inch diameter schedule 40 PVC pipe 42. One end of solid copper wire 40 is connected to the center conductor of coaxial cable 32, while the other end of wire 40 is connected to the outside conductor of coaxial cable 32. One added turn of the outside conductor 33 of the coaxial cable 32 is positioned around the exterior of the PVC pipe 42 as shown in FIG. 1(d). Probe 34 also has a 0.5 inch thick foam spacer 44 attached to the bottom end of pipe 42. The foam spacer 44 raises the probe 34 within the interior 16 of enclosure 12 such that top end of the probe rest against the bottom side of lid 14. The positioning of probe 34 within the interior 16 of enclosure 12 provides for maximum coupling between the low band antenna array being tested and the probe 34.

Referring to FIG. 1(d), the lid 14 for steel enclosure 12, has a centrally located six inch diameter opening 46 and a pair of alignment pins 48 and 50 positioned adjacent opening 46. The opening 46 and alignment pins 48 and 50 within lid 14 allow a user to position the ALR-67 Low Band Antenna Array on top of test chamber 10 with antenna array's monopole antennas precisely positioned within the interior 12 of test chamber 10.

Figure 2:
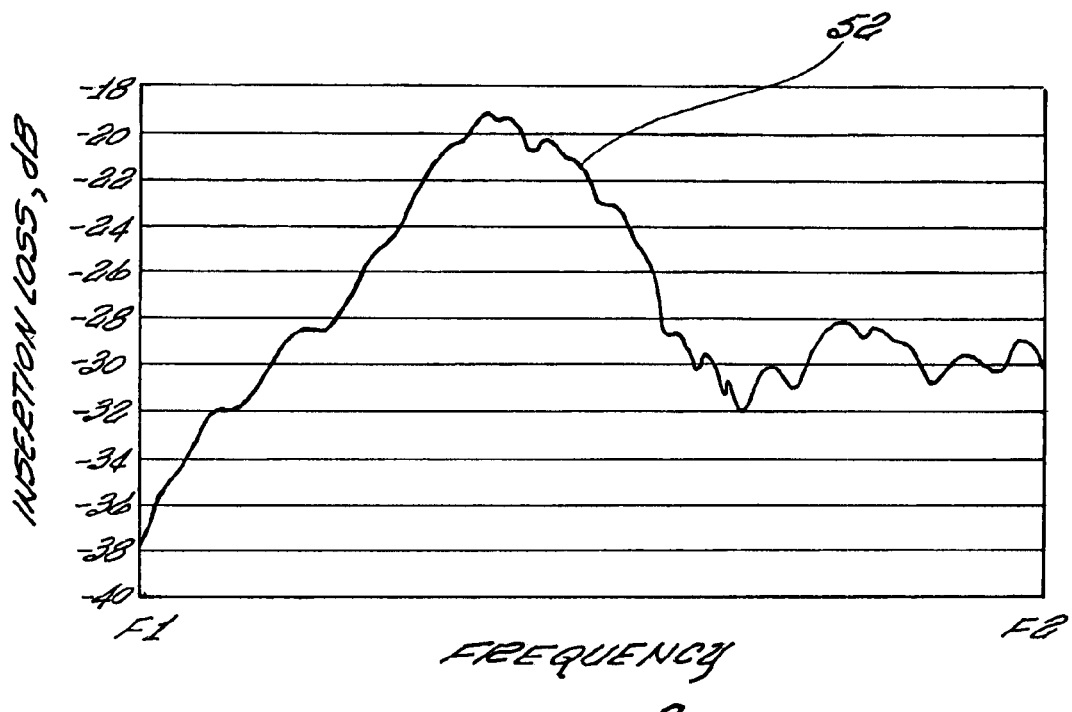
FIG. 2 is a RF insertion loss plot for the test chamber of FIG. 1(a) over the operating frequency of the ALR-67 Low Band Antenna Array.

Referring to FIGS. 1(a) and 2, test chamber 10 was calibrated by the measuring the RF insertion loss of an injected signal to an omni element within the ALR-67 Low Band Antenna Array. FIG. 2 depicts the insertion loss, designated by the reference numeral 52, for the ALR-67 Low Band Antenna Array for a frequency response between frequency F1 and frequency F2. The insertion loss 52 shows no resonant spikes, only a smooth curve over the frequency range from frequency F1 to frequency F2. As shown in FIG. 2, the plot 52 meets a test requirement for an insertion loss of −30 dB plus or minus 10 dB over the operating frequency of the ALR-67 Low Band Antenna Array.

The microwave absorptive foam 18 lining the interior walls 20, 22, 24 and 26 of enclosure 12 and the base 28 of enclosure 12 minimizes electromagnetic reflections within the interior 16 of test chamber 12. Minimizing the reflections of the injected signal produces a distinctive angle of arrival with no ambiguous input signals from reflections at the ALR-67 Low Band Antenna Array.

The test chamber 10 provides for isolation of internal RF signals by preventing the signals from radiating outside of test chamber 10 and isolates external RF signals from entering test chamber 10 which causes interference. The combination of absorptive material 10 and a machined fit with the ALR-67 Low Band Antenna Array minimizes external and internal RF signal interference.

From the foregoing, it is readily apparent that the present invention comprises a new, useful, and exceedingly unique test chamber for testing an antenna array over its operating frequency which constitutes a considerable improvement over the known prior art. Many modifications and variations of the present invention are possible in light of the above teachings. It is to be understood that within the scope of the appended claims the invention may be practiced otherwise than as specifically described.

What is claimed is:

1. A test chamber for testing a frequency response of an output for a low band antenna array having a plurality of monopole antennas by providing an RF (radio frequency) test signal into an interior of said test chamber, comprising:
   (a) a rectangular shaped base;
   (b) first and second side walls extending perpendicularly upward from said base, a rear wall extending perpendicularly upward from said base and a front wall extending perpendicularly upward from said base, one end of each of said first and second side walls being attached to a separate one of the opposed ends of said front wall and the other end of each of each of said first and second side walls being attached to a separate one of the opposed ends of said rear wall to form a rectangular shaped assembly of upstanding walls;
   (c) a layer of microwave absorptive foam affixed to upper surface of said base and the interior of said first and second side walls, said front wall and said rear wall;
   (d) a rectangular shaped lid mounted on a upper edge of said rectangular shaped assembly of upstanding walls, said rectangular shaped lid being removable from said rectangular shaped assembly of upstanding walls, said rectangular shaped lid having a centrally located opening adapted to receive said low band antenna array;
   (e) a probe mounted in the interior of said test chamber, said probe providing said RF test signal, said probe including:
      (I) a foam spacer;
      (II) a non-metallic pipe affixed to an upper surface of said foam spacer; and
      (III) a cooper wire wound around the exterior of said non-metallic pipe; and
   (f) a cable positioned within the interior of said test chamber, said cable being connected to said copper wire at one end thereof said cable extending through an opening within the front wall of said test chamber, said cable having a female connector attached to the opposite end thereof.

2. The test chamber of claim 1 wherein said non-metallic pipe comprises a one inch diameter schedule 40 PVC pipe.

3. The test chamber of claim 1 wherein said test chamber has overall dimensions of 10.00 inches in length, 8.00 inches in width and 4.00 inches in depth.

4. The test chamber of claim 1 wherein said copper wire includes five helical turns of #22 solid copper wire wound around the exterior of said non-metallic pipe.

5. The test chamber of claim 1 wherein said layer of microwave absorptive foam has a thickness of approximately 1.70 inches.

6. The test chamber of claim 1 further comprising a pair of alignment pins positioned adjacent the opening within said lid, the opening and the alignment pins of said lid allowing a user to precisely position the monopole antennas of said low band antenna array within the interior of said test chamber.

7. The test chamber of claim 1 wherein said test chamber allows for a measurement of an insertion loss over an operating frequency for said low band antenna array.

8. The test chamber of claim 7 wherein said insertion loss is not greater than −30 dB plus or minus 10 dB.

9. The test chamber of claim 1 wherein said rectangular shaped assembly of upstanding walls, said base and said lid are fabricated from steel.

10. The test chamber of claim 1 wherein said foam spacer has a thickness of approximately 0.5 inches.

11. A test chamber for testing a frequency response of an output for a low band antenna array having a plurality of monopole antennas by providing an RF (radio frequency) test signal into an interior of said test chamber, comprising:
   (a) a rectangular shaped base;
   (b) first and second side walls extending perpendicularly upward from said base, a rear wall extending perpendicularly upward from said base and a front wall extending perpendicularly upward from said base, one end of each of said first and second side walls being attached to a separate one of the opposed ends of said front wall and the other end of each of each of said first and second side walls being attached to a separate one of the opposed ends of said rear wall to form a rectangular shaped assembly of upstanding walls;
   (c) a layer of microwave absorptive foam affixed to upper surface of said base and the interior of said first and second side walls, said front wall and said rear wall, said layer of microwave absorptive foam having a thickness of a thickness of approximately 1.70 inches;
   (d) a rectangular shaped lid mounted on a upper edge of said rectangular shaped assembly of upstanding walls, said rectangular shaped lid being removable from said rectangular shaped assembly of upstanding walls, said rectangular shaped lid having a centrally located opening adapted to receive said low band antenna array;
   (e) a probe mounted in the interior of said test chamber, said probe providing said RF test signal, said probe including:
      (I) a foam spacer;
      (II) a non-metallic pipe affixed to an upper surface of said foam spacer; and (III) a cooper wire wound around the exterior of said non-metallic pipe; and (f) a cable positioned within the interior of said test chamber, said cable being connected to said copper wire at one end thereof said cable extending through an opening within the front wall of said test chamber, said cable having a female connector attached to the opposite end thereof; and (g) said test chamber allowing for a measurement of an insertion loss over an operating frequency for said low band antenna array, wherein said insertion loss is not greater than −30 dB plus or minus 10 dB.

12. The test chamber of claim 11 wherein said non-metallic pipe comprises a one inch diameter schedule 40 PVC pipe.

13. The test chamber of claim 11 wherein said test chamber has overall dimensions of 10.00 inches in length, 8.00 inches in width and 4.00 inches in depth.

14. The test chamber of claim 11 wherein said copper wire includes five helical turns of #22 solid copper wire wound around the exterior of said non-metallic pipe.

15. The test chamber of claim 11 further comprising a pair of alignment pins positioned adjacent the opening within said lid, the opening and the alignment pins of said lid allowing a user to precisely position the monopole antennas of said low band antenna array within the interior of said test chamber.

16. The test chamber of claim 11 wherein said rectangular shaped assembly of upstanding walls, said base and said lid are fabricated from steel.

17. The test chamber of claim 11 wherein said foam spacer has a thickness of approximately 0.5 inches.

18. The test chamber for testing a frequency response of an output for a low band antenna array having a plurality of monopole antennas by providing an RF (radio frequency) test signal into an interior of said test chamber, comprising:

(a) a rectangular shaped base;

(b) first and second side walls extending perpendicularly upward from said base, a rear wall extending perpendicularly upward from said base and a front wall extending perpendicularly upward from said base, one end of each of said first and second side walls being attached to a separate one of the opposed ends of said front wall and the other end of each of each of said first and second side walls being attached to a separate one of the opposed ends of said rear wall to form a rectangular shaped assembly of upstanding walls;

(c) a layer of microwave absorptive foam affixed to upper surface of said base and the interior of said first and second side walls, said front wall and said rear wall, said layer of microwave absorptive foam having a thickness of a thickness of approximately 1.70 inches;

(d) a rectangular shaped lid mounted on a upper edge of said rectangular shaped assembly of upstanding walls, said rectangular shaped lid being removable from said rectangular shaped assembly of upstanding walls, said rectangular shaped lid having a centrally located opening adapted to receive said low band antenna array;

(e) said base, said rectangular shaped assembly of upstanding side walls and said lid each being fabricated from steel;

(f) a probe mounted in the interior of said test chamber, said probe providing said RF test signal, said probe including:

(I) a foam spacer;

(II) a non-metallic pipe affixed to an upper surface of said foam spacer, wherein said non-metallic pipe comprises a one inch diameter schedule 40 PVC pipe; and (III) a cooper wire wound around the exterior of said non-metallic pipe, wherein said copper wire includes five helical turns of #22 solid copper wire wound around the exterior of said non-metallic pipe; and (g) a cable positioned within the interior of said test chamber, said cable being connected to said copper wire at one end thereof said cable extending through an opening within the front wall of said test chamber, said cable having a female connector attached to the opposite end thereof;

(h) said test chamber allowing for a measurement of an insertion loss over an operating frequency for said low band antenna array, wherein said insertion loss is not greater than −30 dB plus or minus 10 dB; and (i) said test chamber having dimensions of 10.00 inches in length, 8.00 inches in width and 4.00 inches in depth.

19. The test chamber of claim 18 further comprising a pair of alignment pins positioned adjacent the opening within said lid, the opening and the alignment pins of said lid allowing a user to precisely position the monopole antennas of said low band antenna array within the interior of said test chamber.

20. The test chamber of claim 18 wherein said foam spacer has a thickness of approximately 0.5 inches.

* * * * *

UNITED STATES PATENT AND TRADEMARK OFFICE
CERTIFICATE OF CORRECTION

PATENT NO.    : 6,885,348 B1
DATED         : April 26, 2005
INVENTOR(S)   : Marvin L. Ryken, Jr., Albert F. Davis and Steven J. Renga It is certified that error appears in the above-identified patent and that said Letters Patent is hereby corrected as shown below:

<u>Title page,</u>
Item [73], Assignee: should read -- The United States of America as represented by the Secretary of the Navy, Washington DC (US) --.
Item [74], should read:
-- *Attorney, Agent, or Firm* - David S. Kalmbaugh --.

Signed and Sealed this

Twenty-second Day of November, 2005

JON W. DUDAS
*Director of the United States Patent and Trademark Office*